United States Patent [19]

Nagai et al.

[11] Patent Number: 5,126,804
[45] Date of Patent: Jun. 30, 1992

[54] LIGHT INTERACTIVE HETEROJUNCTION SEMICONDUCTOR DEVICE

[75] Inventors: Yutaka Nagai; Akira Takemoto; Hitoshi Watanabe, all of Itami, Japan

[73] Assignee: Mitsubishi Denki Kabushiki Kaisha, Japan

[21] Appl. No.: 710,366

[22] Filed: Jun. 3, 1991

[30] Foreign Application Priority Data

Nov. 14, 1990 [JP] Japan .................... 2-311106

[51] Int. Cl.$^5$ ............................ H01L 33/00
[52] U.S. Cl. ........................... 357/17; 357/4; 357/16; 357/55; 372/48; 372/43; 372/46; 372/45; 372/47
[58] Field of Search ............. 357/4, 55, 17, 16; 372/48, 46, 45, 47, 43, 44

[56] References Cited

U.S. PATENT DOCUMENTS 4,835,578  5/1989  Ohtoshi et al. ............. 357/16 X
5,054,030 10/1991  Sakaki ....................... 372/45

OTHER PUBLICATIONS

Kapon et al., "Single Quantum Wire Semiconductor Lasers," *Applied Physics Letters*, vol. 55, No. 26, Dec. 25, 1989, pp. 2715–2717.
Arakawa et al., "Quantum Well Lasers–Gain, Spectra, Dynamics," *IEEE Journal of Quantum Electronics*, vol. QE-22, No. 9, Sep., 1986, 1887–97.
Arakawa et al., "Multidimensional Quantum Well Laser and Temperature Dependence of Its Threshold Current," *Appl. Phys. Lett.*, vol. 40, No. 11, Jun. 1, 1982, pp. 939–941.
Kroemer et al., "Some Design Considerations for Multi-Quantum-Well Lasers," *Japanese Journal of Applied Physics*, vol. 23, No. 8, Aug. 1984, pp. 970–974.
Petroff et al., "Toward Quantum Well Wires: Fabrication and Optical Properties," *Appl. Phys. Lett.*, 41(7), Oct. 1, 1982, pp. 636–638.
Sakaki, "Scattering Suppression and High-Mobility Effect of Size-Quantized Electrons in Ultrafine Semiconductor Wire Structures," *Japanese Journal of Applied Physics*, vol. 19, No. 12, Dec. 1980, pp. L735–L738.
Asada et al., "Theoretical Gain of Quantum-Well Wire Lasers," *Japanese Journal of Applied Physics*, vol. 24, No. 2, Feb. 1985, pp. L95–L97.
Kapon et al., "Single Quantum Wire Semiconductors Lasers", Applied Physics Letters, vol. 55, No. 26, 1989, pp. 2715–2717.

*Primary Examiner*—William Mintel
*Attorney, Agent, or Firm*—Leydig, Voit & Mayer

[57] ABSTRACT

A semiconductor optical element includes a semiconductor layer on a semiconductor substrate, a plurality of parallel stripe-shaped grooves in the layer having widths sufficiently narrow to produce a quantum effect and spaced at an interval sufficiently narrow to produce a quantum effect in a semiconductor layer disposed between adjacent grooves, and a structure including alternating semiconductor quantum well and barrier layers disposed on the semiconductor layer in which the quantum well layer thickness is less than the depth of the grooves and sufficiently thin to produce a quantum effect and the barrier layer thickness is larger than the depth of the grooves, the quantum well and barrier layers being alternatingly disposed on the semiconductor layer in the grooves and on regions between adjacent grooves.

20 Claims, 9 Drawing Sheets

F I G. 1
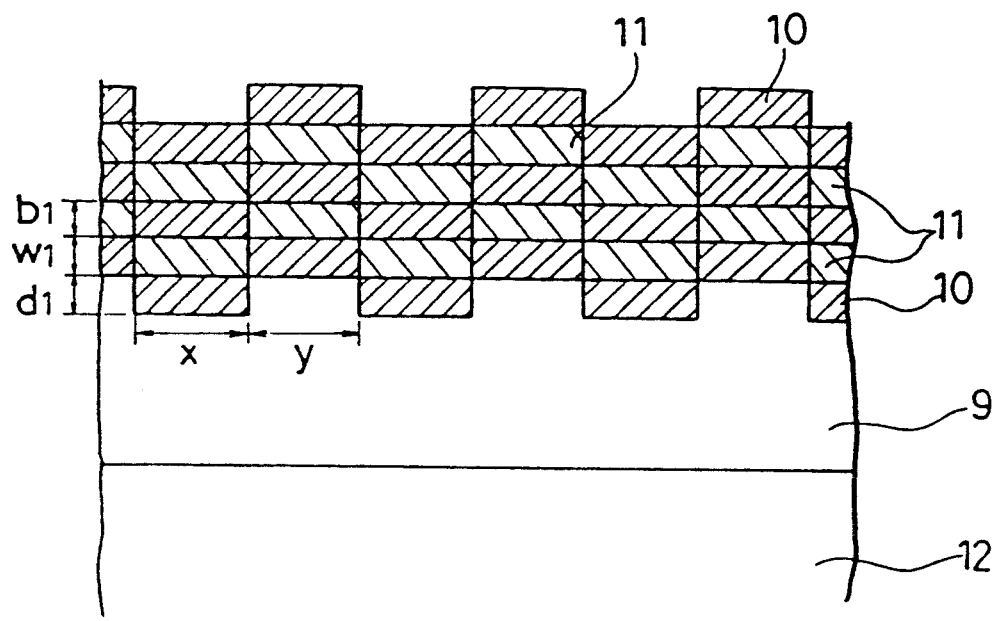
F I G. 4
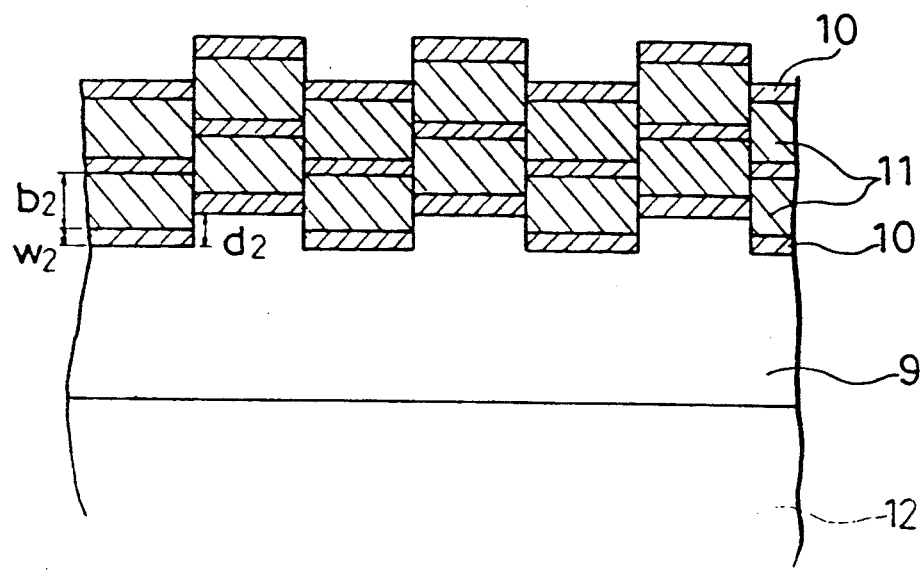

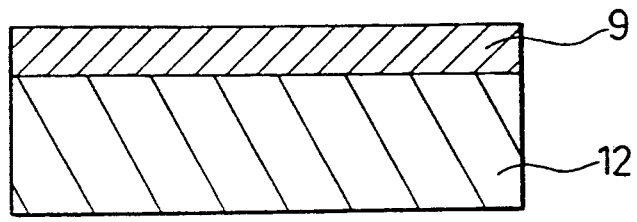
F I G. 8(a)
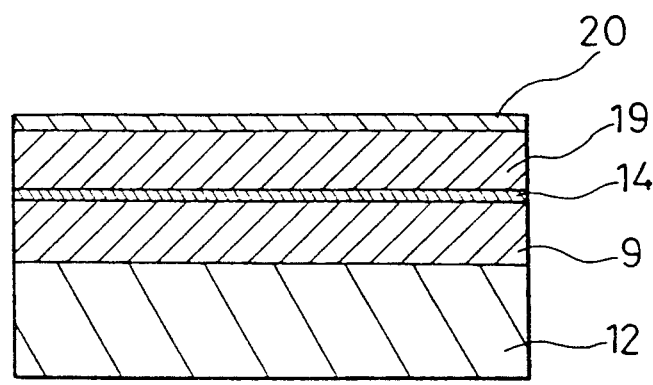
F I G. 8(b)
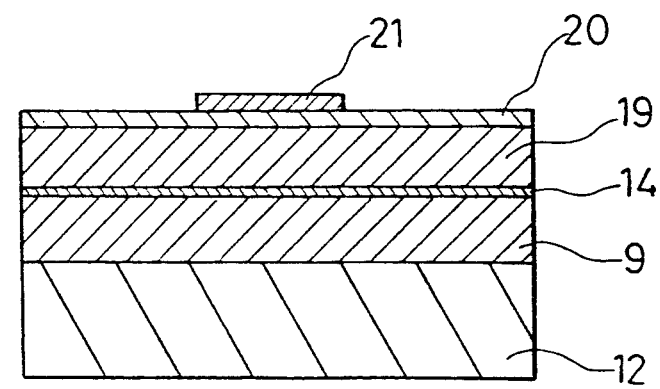
F I G. 8(c)

LIGHT INTERACTIVE HETEROJUNCTION SEMICONDUCTOR DEVICE

FIELD OF THE INVENTION

The present invention relates to a semiconductor optical element and a manufacturing method therefor and, more particularly, to a semiconductor optical element including a plurality of quantum wires or quantum boxes in its active region and a method for easily fabricating the same.

BACKGROUND OF THE INVENTION

FIG. 2 is a cross-sectional view showing a structure of a quantum wire semiconductor laser device disclosed in a paper by E.Kapon, Applied Physics Letter 55(26), 25th December 1989, pp. 2715 to 2717. The device of FIG. 2 includes an n+ type GaAs substrate 1 patterned with a V-shaped stripe groove. An n type $Al_yGa_{1-y}As$ cladding layer 2, an $Al_xGa_{1-x}As$ first SCH (Separate Confinement Heterostructure) layer 3, a GaAs quantum well layer 4, an $Al_xGa_{1-x}As$ second SCH layer 5, a p type $Al_yGa_{1-y}As$ cladding layer 6, and a p+ type GaAs contact layer 7 are successively laminated on the substrate 1 keeping the configuration of the V-shaped stripe groove. A p side electrode 8 is disposed on the contact layer 7 and an n side electrode (not shown here) is disposed on the entire rear surface of the substrate 1. A high resistance region 22 is formed in the p type $Al_yGa_{1-y}As$ cladding layer 6 and the p+ type GaAs contact layer 7 by proton implantation A description is given of the operation.

When a current at least equal to the threshold current or more is injected in the forward direction to the pn junction of the quantum wire semiconductor laser shown in FIG. 2, laser oscillation occurs in the well layer 4 and laser light is emitted. While an ordinary semiconductor laser has an active region of approximately 0.05 to 0.2 micron thickness, a quantum well laser generally has a quantum well layer of no more than approximately 300 angstroms thickness. In such a thin layer, a quantum effect occurs so that electrons are localized in the film thickness direction. As a result, a higher gain is obtained in the quantum well laser than in the ordinary semiconductor laser and reductions in the threshold current and the operation current are expected. The quantum wire semiconductor laser is obtained because that quantization is also realized in the horizontal direction in addition to the layer thickness direction. This quantum wire semiconductor laser can present more significant quantization effects.

In the quantum wire semiconductor laser device shown in FIG. 2, a potential barrier is also formed in the horizontal direction by the epitaxial growth layers on the V-shaped groove. Electrons and holes are confined in the potential barrier and then quantized. In addition, when the length of the quantum wire stripe is no more than approximately 500 angstroms, a so-called quantum box in which electrons and holes are confined three-dimensionally is obtained, so that the quantum effect is more apparent.

In the device of FIG. 2, the width $W_z$ of the quantum wire in the horizontal direction largely depends on the configuration of the V-shaped groove and the rate of the epitaxial growth of the epitaxial growth layers. This makes it quite difficult to control the width $W_z$ precisely. Further, the maximum output power of a semiconductor laser is generally limited to a level at which catastrophic optical damage (hereinafter referred to as COD) of the facet occurs. In order to heighten the COD level to enhance the maximum output power, it is required to increase the cross-sectional area of the light emitting region. However, in the structure of FIG. 2, it is impossible to provide two or more quantum wires in the active region 1, making it impossible to obtain a high output power.

FIG. 3(a) is a cross-sectional view showing a semiconductor laser device utilizing a two-dimensional multi quantum well structure, disclosed in Japanese Published Patent Application No. 63-29989. The device of FIG. 3(a) has a p type GaAs substrate 31. A p type $Al_{0.3}Ga_{0.7}As$ cladding layer 32 is disposed on the substrate 31. A two-dimensional multi-quantum well active layer 37 having stripe configuration, connecting the facets and constituting a resonator, is disposed on a center part of the cladding layer 32 relative to the width of the laser device. A silicon dioxide ($SiO_2$) insulating film 38 is disposed on the cladding layer 32 and the side walls of the active layer 37. An n type $Al_{0.3}Ga_{0.7}As$ cladding layer 39 is disposed on the insulating film 38 and the active layer 37. An n type GaAs contact layer 40 is disposed on the cladding layer 39. A p side electrode 42 is disposed on the rear surface of the substrate 31 and an n side electrode 41 is disposed on the contact layer 40.

A description is given of the structure and production process of the two-dimensional multi-quantum well active layer 37 of this prior art laser device. FIGS. 3(b) and 3(c) show the production process of the two-dimensional multi-quantum well active layer 37 shown in FIG. 3(a).

First, cladding layer 32 is epitaxially grown on the substrate 31. Then, an AlGaAs layer 33A of 50 angstroms thickness and a GaAs layer 33B of 50 angstroms thickness are alternatingly laminated ten times on cladding layer 32 to form a laminated structure. Thereafter, photoresist film 34 is patterned on the laminated structure, and then the laminated structure comprising AlGaAs layers 33A and GaAs layers 33B is etched away using photoresist film 34 as a mask. Then, the side surface of the remaining laminated structure is further etched away by a reactive ion etching to form periodic concave parts 33C each having a depth 1 as shown in FIG. 3(b). Here, the depth 1 is 50 angstroms. Such an etching configuration can be realized because it is possible in reactive ion etching to set the etching rate of AlGaAs about 200 times as high as that of GaAs by setting the etching conditions appropriately.

Next, on the side surface of the laminated structure having periodic concave parts 33C, a GaAs film 37B and an AlGaAs film 37A are alternatively grown by a vapor phase epitaxy. By using the vapor phase epitaxy method, respective films are grown on the side surface of the laminated structure reproducing the concavo-convex configuration thereof precisely, as shown in FIG. 3(c). The alternating growths of GaAs film 37B and AlGaAs film 37A are repeated until the width of active region 37 becomes approximately 0.8 to 1 micron, resulting in the structure shown in FIG. 3(c).

Thereafter, the laminated structure comprising AlGaAs layer 33A and GaAs layer 33B is etched away by a usual photolithography technique and a dry etching so as to form active region 37 in a stripe configuration Then, insulating film 38, cladding layer 39 and contact layer 40 are formed thereon and the electrodes 41 and 42 are formed on the contact layer 40 and on the rear surface of substrate 31, respectively. Thus, the laser structure shown in FIG. 3(a) is completed.

A description is given of the operation hereinafter.

In the device of FIG. 3(a), when a voltage is applied across the electrodes 41 and 42 in a forward direction with respect to the pn junction, carriers are injected into active layer 37 and then confined in a region having a small energy band gap in active layer 37, i.e., in GaAs film 37B shown in FIG. 3(c), and recombine therein, thereby emitting light. The emitted light is reflected and amplified between the cleavage facets provided opposite to each other and perpendicular to the active layer stripe, thereby producing laser oscillation. Here, since GaAs film 37B has a very narrow and slender linear configuration whose cross-sectional dimension is approximately 50 angstroms along each edge, superior laser characteristics, i.e., reduced current, due to the effect of the quantization of injected carriers can be obtained. In addition, in this prior art structure, it is possible to form a plurality of quantum wires in the active layer, so that a laser device having a high output power can be realized.

In the prior art quantum wire semiconductor laser device constituted as described above, several etching processes are required for forming the active layer and, therefore, the production process is quite complicated. In addition, it is quite difficult to apply the prior art quantum wire structure to a general laser device such as a ridge type laser device or a groove type laser device.

SUMMARY OF THE INVENTION

It is an object of the present invention to provide a semiconductor optical element including an active region having a plurality of quantum wires, that can be applied to a ridge type laser device or a groove type laser device and that can be formed by a simple production process.

It is another object of the present invention to provide a semiconductor optical element including an active region having a plurality of quantum wires in which the quantum effect is further enhanced.

It is still another object of the present invention to provide a semiconductor optical element including an active region having a plurality of quantum boxes that are further enhanced in quantum effects over the quantum wires.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor optical element includes a semiconductor substrate or a semiconductor layer formed on a semiconductor substrate; a plurality of stripe-shaped groove each having a rectangular cross-section whose width is sufficiently narrow to produce a quantum effect, formed on the semiconductor substrate or the semiconductor layer parallel to each other at an interval sufficiently narrow to produce a quantum effect or a plurality of rectangular-shaped grooves having a width and a length sufficiently narrow to produce a quantum effect, provided on the semiconductor substrate or the semiconductor layer in a checkerboard arrangement; and a structure in which quantum well layer whose thicknesses are less than the depth of the grooves and sufficiently thin to produce a quantum effect and a barrier layers whose thicknesses are larger than the depth of the grooves are alternatingly laminated and alternatively disposed on the bottom surfaces of the grooves and on regions between the adjacent grooves. Therefore, an active region comprising a plurality of quantum wires or quantum boxes can be obtained by a simple production process. In addition, this quantum wire or quantum box structure can be employed for an active region of a ridge type semiconductor laser, a groove type semiconductor laser or the like.

According to another aspect of the present invention, a method for manufacturing a semiconductor optical element includes steps of forming a plurality of stripe-shaped grooves each having a rectangular cross-section whose width is sufficiently narrow to produce a quantum effect, on a semiconductor substrate or on a semiconductor layer formed on the substrate parallel to each other at an interval sufficiently narrow to produce a quantum effect or forming a plurality of rectangular-shaped grooves each having a width and a length sufficiently narrow to produce a quantum effect, on the semiconductor substrate or the semiconductor layer in a checkerboard arrangement; and alternatingly laminating quantum well layers having thicknesses less than the depth of the grooves and sufficiently thin to occur a quantum effect and a barrier layers having thicknesses larger than the depth of the grooves, on the wafer having the grooves while maintaining the concavo-convex configuration of the grooves. Therefore, a laser element having a structure comprising a plurality of quantum wires or quantum boxes can be produced without complicated etching processes or the like.

BRIEF DESCRIPTION OF THE DRAWINGS

FIG. 1 is a cross-sectional view showing a quantum wire structure of a semiconductor optical element in accordance with an embodiment of the present invention;

FIG. 4 is a cross-sectional view showing a quantum wire structure of a semiconductor optical element in accordance with another embodiment of the present invention;

FIGS. 8(a) to 8(e) are cross-sectional views showing process steps for producing the ridge type semiconductor laser device.

DETAILED DESCRIPTION OF THE PREFERRED EMBODIMENTS

Figure 2:
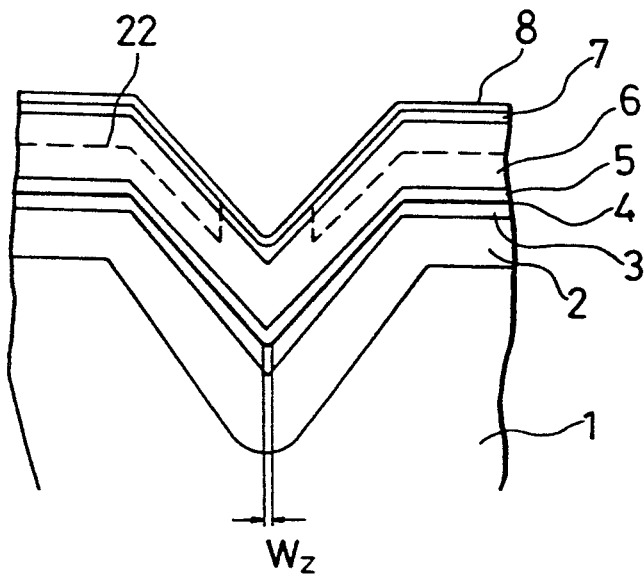
FIG. 2 is a cross-sectional view showing a structure of a prior art quantum wire laser device.
Figure 3A:
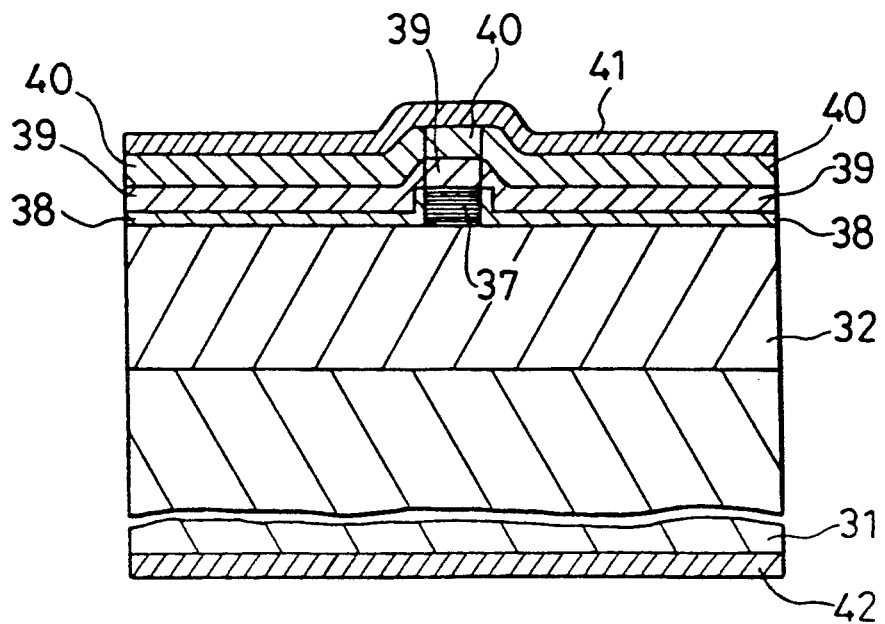
FIG. 3(a) is a cross-sectional view showing a structure of another prior art quantum wire laser device and FIGS. 3(b) and 3(c) illustrate steps in making the structure of FIG. 3(a)
Figure 3B:
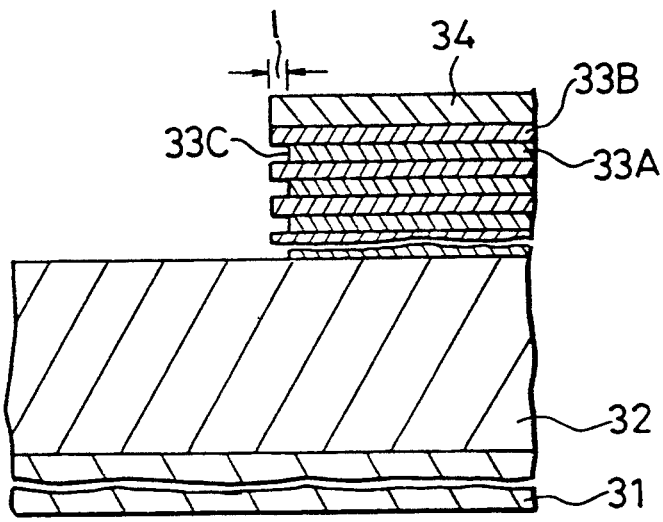
Figure 3C:
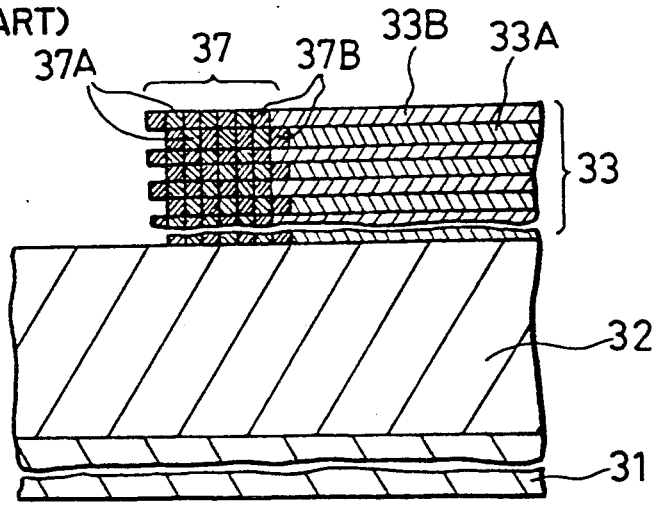

Embodiments of the present invention will be described in detail with reference to the drawing.

FIG. 1 is a cross-sectional view showing a quantum wire structure of a semiconductor optical element in accordance with an embodiment of the present invention. FIG. 4 is a cross-sectional view showing a quantum wire structure of a semiconductor optical element in accordance with another embodiment of the present invention.

In these figures, reference numeral 12 designates an n type GaAs substrate. An n type AlGaAs cladding layer 9 is disposed on the substrate 12. A plurality of stripe-shaped grooves each having a rectangular cross-section of depth $d_1$ and width x are formed on the cladding layer 9 parallel to each other with a separation interval of y. Well layers 10 of thicknesses $w_1$ and barrier layers 11 of thicknesses $b_1$ are alternatingly laminated and alternatively disposed on the bottom surface of the stripe-shaped grooves of the cladding layer 9 and on the regions between the adjacent grooves.

Here, well layer 10 comprises, for example, GaAs and barrier layer 11 comprises, for example, AlGaAs having an energy band gap approximately equal to that of cladding layer 9. The n type AlGaAs cladding layer 9 has a higher energy band gap than that of GaAs well layer 10, so that this cladding layer 9 functions as a barrier layer. In the embodiment of FIG. 1, the depth of groove $d_1$, the thickness of well layer $w_1$ and the thickness of barrier layer $b_1$ have the following relations:

$$d_1 = w_1 = b_1$$

so that the stripe-shaped groove is completely filled up by first well layers 10 and also newly formed grooves are completely filled up by barrier layers 11. In this structure, each well layer 10 is two-dimensionally surrounded by the barrier layers. That is, the upper, lower and both side surfaces thereof are surrounded by the barrier layers. In addition, since the width of stripe-shaped groove x and the interval y between the adjacent grooves are equal to each other, the well layer formed on the groove has the same dimension as that of the well layer formed on a region between the adjacent grooves. Here, in order to induce the well layer 10 to have an effect as a quantum wire, it is required to set the widths x and y and thickness $d_1$ to approximately 200 angstroms or less.

In accordance with another embodiment of the present invention shown in FIG. 4, the depth of the stripe-shaped grooves $d_2$, the thickness of well layer $w_2$ and the thickness of barrier layer $b_2$ have the following relation;

$$w_2 < b_2, (w_2 + b_2)/2 = d_2$$

where the thickness of well layer $w_2$ is smaller than the thickness of barrier layer $b_2$ and the half of the sum of $w_2$ and $b_2$ is equal to the depth of groove $d_2$. In this case, well layer 10 is positioned at a center part of the adjacent barrier layers 11 in the layer thickness direction and thus each well layer 10 is completely surrounded by barrier layers 11. Therefore, the edges of each well layer 10 are not in contact with any edges of other well layer as shown in FIG. 1, so that the quantum effect is obtained more completely.

A description is given of a quantum box structure that further enhances the quantum effect.

In the structures shown in FIGS. 1 and 4, when not only the thickness w and the widths x and y of the well layer but also the length z thereof is set to approximately 200 angstroms or less, a quantum box structure is achieved. In that structure, each well layer 10 is three-dimensionally surrounded by barrier layers 11, that is, the upper and lower surfaces, both side surfaces and the side surfaces perpendicular to the length direction of well layer 10 are surrounded by barrier layers 11. In this quantum box structure, the quantum effect becomes even more apparent.

A description is given of a production process of the quantum wire structure or quantum box structure of the semiconductor optical element in accordance with the above embodiments.

FIGS. 5(a) to 5(d) are cross-sectional views showing process steps for producing the quantum wire or quantum box structure in accordance with the embodiment of FIG. 4.

Figure 5A:
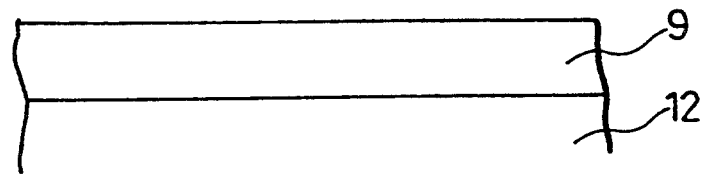
FIGS. 5(a) to 5(d) are cross-sectional views showing process steps for producing the quantum wire or quantum box structure of FIG. 4.
Figure 5B:
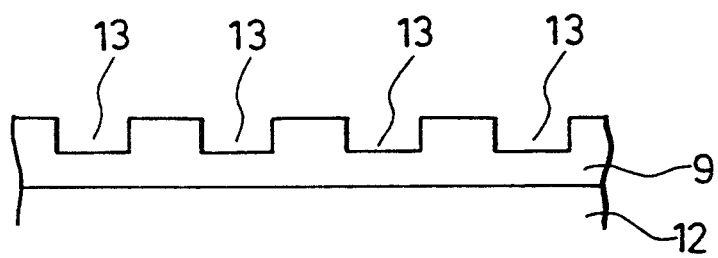
Figure 6A:
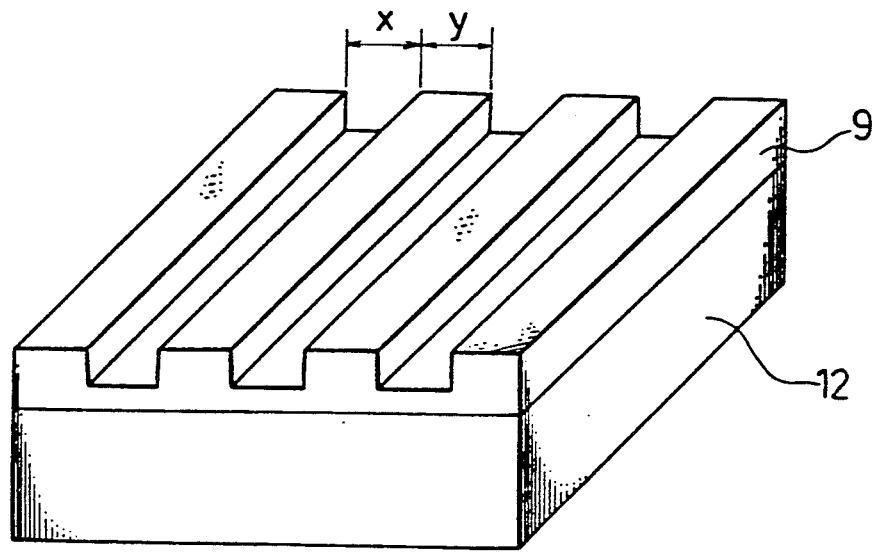
FIG. 6(a) is a perspective view showing a semiconductor layer formed in a quantum wire structure.
Figure 6B:
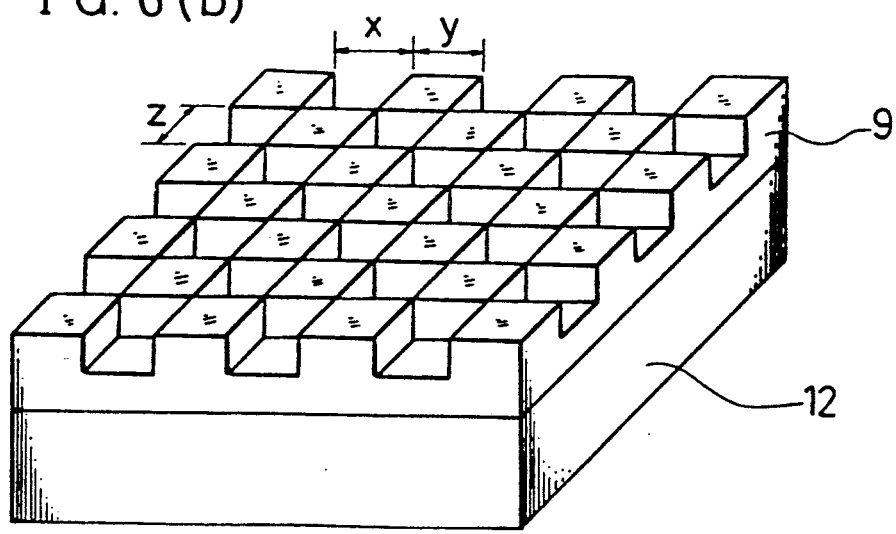
FIG. 6(b) is a perspective view showing a semiconductor layer formed in a quantum box structure.

First, as shown in FIG. 5(a), a semiconductor layer 9 having an energy band gap corresponding to that of the barrier layer of the quantum well structure is epitaxially grown on semiconductor substrate 12. Then, as shown in FIG. 5(b), portions of semiconductor layer 9 are etched away by a dry etching to form stripe-shaped grooves each having a rectangular cross-section whose dimension is sufficiently small to produce the effect of a quantum wire, or rectangular-shaped grooves arranged in a checkerboard configuration whose dimension is sufficiently small to produce the effect of a quantum box. FIGS. 6(a) and 6(b) are perspective views respectively showing a semiconductor layer processed for the quantum wire and a semiconductor layer processed for the quantum box. In these figures, respective dimensions x, y and z are set to approximately 200 angstroms or less.

Figure 5C:
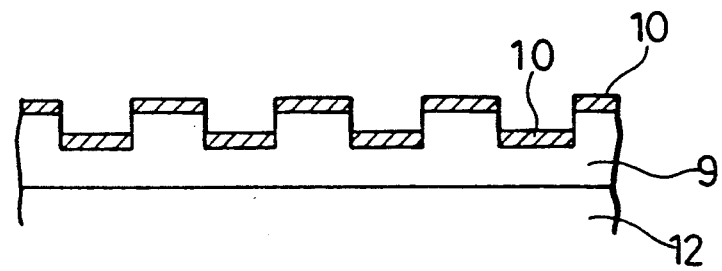
Figure 5D:
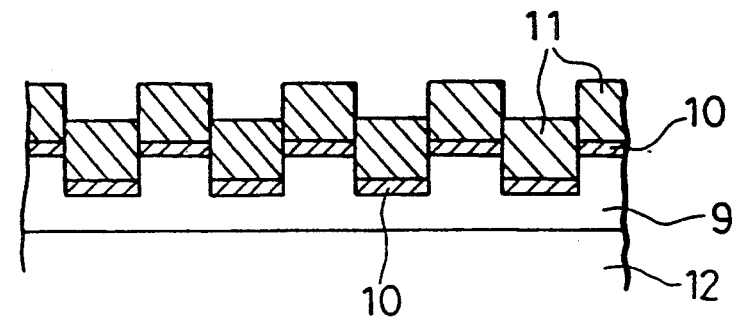

Then, as shown in FIG. 5(c), first well layer 10 is formed on the grooves and, thereafter, as shown in FIG. 5(d), first barrier layer 11 is formed on the well layer 10. In this way, well layer 10 and the barrier layer 11 are alternatingly laminated for several times. The thicknesses of these layers are set such that the thickness of well layer 10 is smaller than that of barrier layer 11 and the sum of the thickness of barrier layer 11 and the thickness of well layer 10 is twice as large as the depth of the groove. In order to form the structure shown in FIG. 1, the thicknesses of well layer 10 and barrier layer 11 should be equal to the depth of the groove. As the crystal growth method, a growth method that can maintain the configuration of the processed semiconductor layer and can form a thin film of 100 angstroms thickness with high reproducibility, for example, a vapor phase epitaxial growth such as MBE (Molecular Beam Epitaxy) or MO-CVD (Metal Organic Chemical Vapor Deposition) is preferably employed.

In the above-described production method, since the processes of depositing the well layer 10 and the barrier layer 11 are alternatingly repeated, a structure including a plurality of quantum wires or quantum boxes can be easily obtained.

In addition, since the quantum wire or quantum box structure of this embodiment has grooves directly formed on the semiconductor layer on the semiconductor substrate and the laminated layer structure is formed thereon, this structure can be easily employed for an active region of a semiconductor laser which can be fabricated by a relatively simple process, such as a ridge type semiconductor laser or a groove type semiconductor laser. As a result, a high performance quantum wire or quantum box laser device is realized.

Figure 7A:
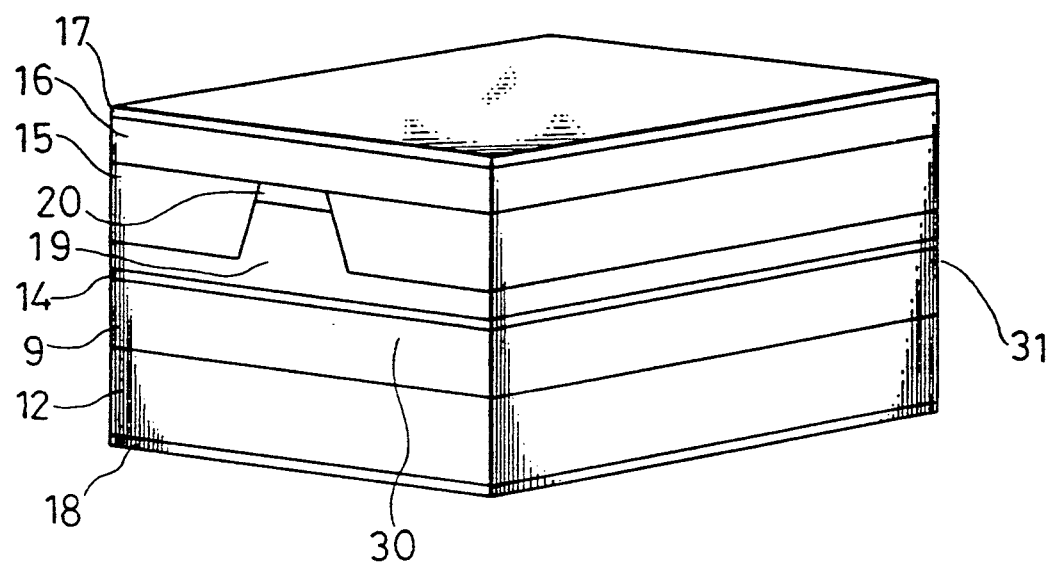
FIG. 7(a) is a perspective view showing a ridge type semiconductor laser having an active region of quantum wire or quantum box structure.
Figure 7B:
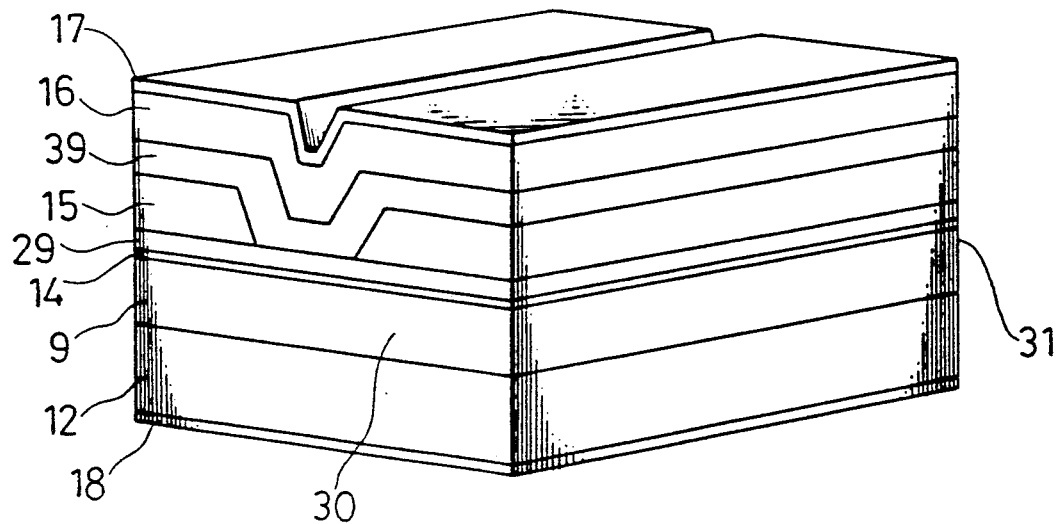
FIG. 7(b) is a perspective view showing a groove type semiconductor laser having an active region of quantum wire or quantum box structure.

FIGS. 7(a) and 7(b) ar perspective views each showing a semiconductor laser in which the quantum wire structure shown in FIG. 1 or 4 is employed for an active region thereof, in which FIG. 7(a) shows a ridge type semiconductor laser and FIG. 7(b) shows a groove type semiconductor laser.

The device of FIG. 7(a) has an n type GaAs substrate 12. An n type AlGaAs lower cladding layer 9 is disposed on substrate 12. An active layer 14 including a quantum wire structure is disposed on cladding layer 9. A p type AlGaAs upper cladding layer 19 is disposed on active layer 14. The cladding layer 19 has a stripe-shaped ridge part which connects cleavage facets 30 and 31. A p type GaAs cap layer 20 is disposed on the ridge part of cladding layer 19 An n type GaAs current blocking layer 15 is disposed on cladding layer 19 so as to embed the ridge part. A p type GaAs contact layer 16 is disposed on current blocking layer 15 and cap layer 20. A p side electrode 17 is disposed on contact layer 16 and an n side electrode 18 is disposed on the rear surface of substrate 12.

In FIG. 7(b), like elements are given the same numerals as those shown in FIG. 7(a). A p type AlGaAs first upper cladding layer 29 is disposed on active layer 14. An n type GaAs current blocking layer 15 is disposed on first cladding layer 29. This current blocking layer 15 has a stripe-shaped groove serving as a current path. A p type AlGaAs second cladding layer 39 is disposed on current blocking layer 15 and first upper cladding layer 29 along the groove configuration of current blocking layer 15. A p type GaAs contact layer 16 is disposed on second upper cladding layer 39. A p side electrode 17 is disposed on contact layer 16 and an n side electrode 18 is disposed on the rear surface of substrate 12, respectively.

A description of a production method of the ridge structure semiconductor laser shown in FIG. 7(a) is given with reference to FIGS. 8(a)-8(e).

First, as shown in FIG. 8(a), n type AlGaAs cladding layer 9 is grown on p type substrate 12 by a first crystal growth. Then, grooves for forming quantum wires or quantum boxes shown in FIG. 6(a) or 6(b) are formed on n type AlGaAs cladding layer 9. Thereafter, a layer serving as a part of n type AlGaAs cladding layer 9 is grown thereon and then quantum wire or quantum box layer 14 comprising a plurality of well layers and barrier layers is grown thereon as described in the embodiments of FIGS. 1 and 4. P type AlGaAs cladding layer 19 and p type GaAs cap layer 20 are grown thereon. Here, the layer serving as a part of cladding layer 9, quantum wire or quantum box layer 14, p type AlGaAs cladding layer 19 and p type GaAs cap layer 20 are successively grown by a second crystal growth. FIG. 8(b) is a cross-sectional view of the wafer in a state after the second crystal growth.

Then, as shown in FIG. 8(c), a SiO₂ film is formed on the surface of the wafer by sputtering, electron beam deposition or the like and, thereafter, portions of the SiO₂ film are removed by a photolithography and etching technique to form SiO₂ film 21 in a stripe configuration. The thickness and the stripe width of SiO₂ film 21 are, for example, 0.1 to 1.0 micron and 2 to 10 microns, respectively. Hydrofluoric acid or the like is used as etchant for etching the SiO₂ film.

Figure 8D:
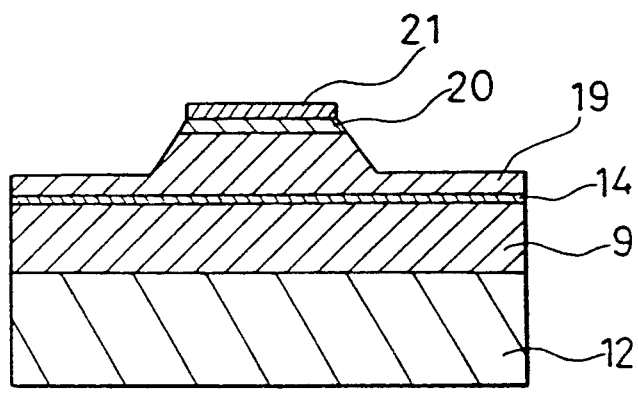

Then, as shown in FIG. 8(d), portions of p type GaAs cap layer 20 and p type AlGaAs cladding layer 19 are removed by etching to form a ridge configuration. Here, the width of the bottom part of the ridge is desired to be in a range from 2 microns to 10 microns to control the transverse ascillation mode of the laser.

Figure 8E:
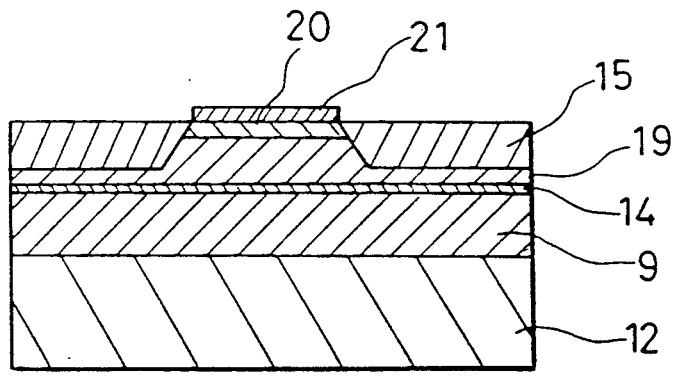

Then, as shown in FIG. 8(e), the ridge part is buried by n type GaAs layer 15 by a third crystal growth.

After the third crystal growth, SiO₂ film 21 is removed and p type GaAs contact layer 16 is formed on the wafer by a fourth crystal growth. When all crystal growth processes are finished, n side electrode 18 is formed on the rear surface of substrate 12 and p side electrode 17 is formed on p type GaAs contact layer 16. Thereafter, the wafer is divided into chips, thereby completing laser elements.

Figure 9A:
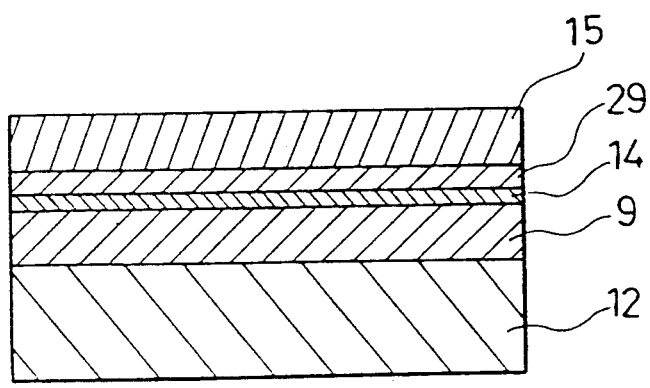
FIGS. 9(a) and 9(b) are cross-sectional views showing process steps for producing a groove type semiconductor laser device.
Figure 9B:
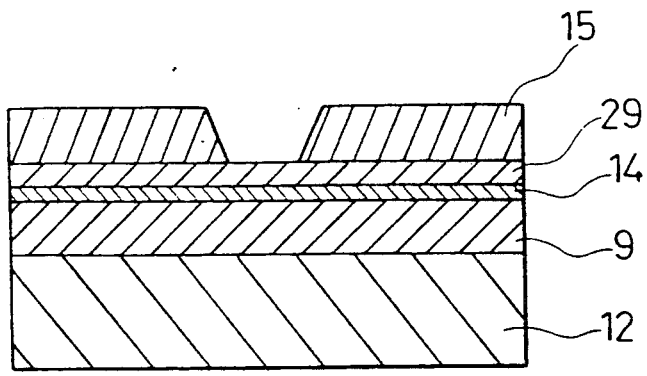

A description is given of a production method of the groove type semiconductor laser shown in FIG. 7(b) with reference to FIGS. 9(a) and 9(b).

After forming quantum wire or quantum box layer 14 by the same steps as described above, p type AlGaAs first upper cladding layer 29 and n type GaAs current blocking layer 15 are successively grown thereon. FIG. 9(a) is a sectional view of the wafer in a state after the crystal growth.

Thereafter, a stripe-shaped groove is formed in n type GaAs current blocking layer 15 by a photolithography and etching technique. The surface of p type AlGaAs first upper cladding layer 29 is exposed at the bottom of the groove N type GaAs current blocking layer 15 can be selectively removed using a solution of ammonia and hydrogen peroxide as etchant. The cross-section of the wafer in this state is shown in FIG. 9(b). After forming the groove, p type AlGaAs second upper cladding layer 39 and p type GaAs contact layer 16 are successively formed on the wafer by crystal growth. Thereafter, n side electrode 18 is formed on the rear surface of substrate 12 and p side electrode 17 is formed on p type GaAs contact layer 16, respectively. Then, the wafer is divided into chips, thereby completing laser elements.

In the above-described two structures, n type GaAs current blocking layer 15 both concentrates the current into a region directly below the ridge part or directly below the stripe-shaped groove and absorbs the laser light generated in the active region at both sides of laser light, to stabilize the horizontal transverse oscillation mode. When the above-described quantum wire or quantum box structure is adopted for the active region of such laser structures, a semiconductor laser device having high performance such as low threshold value, low operation current and high speed switching can be obtained.

While in the above-described embodiments AlGaAs series semiconductor lasers are described, the present invention can be also applied to other material semiconductor lasers.

In addition, although the ridge type semiconductor laser and the groove type semiconductor laser are described in the above-illustrated embodiments, the quantum wire or quantum box structure of the present invention can be applied to other semiconductor lasers such as an electrode stripe type laser or a buried heterojunction type laser.

In addition, the quantum wire or quantum box structure of the present invention can be applied not only to semiconductor lasers but also to semiconductor elements such as light waveguides or optical switching elements. In these cases, superior device performance can be realized on the basis of the quantum effects.

As is evident from the foregoing description, according to the present invention, a semiconductor optical element includes a semiconductor substrate or a semiconductor layer formed on a semiconductor substrate; a plurality of stripe shaped grooves each having a rectangular cross-section whose width is sufficiently narrow to produce a quantum effect, provided on the semiconductor substrate or the semiconductor layer parallel to each other at an interval sufficiently narrow to produce a quantum effect or a plurality of rectangular-shaped grooves having a width and a length sufficiently narrow to produce a quantum effect, provided on the semiconductor substrate or the semiconductor layer in a checkerboard arrangement; and a structure including quantum well layers whose thicknesses are less than the depth of the groove and sufficiently thin to produce a quantum effect and barrier layers whose thicknesses are larger than the depth of the groove are alternatingly laminated and alternatively disposed on the bottom surfaces of the grooves formed in the semiconductor substrate or the semiconductor layer and on regions between adjacent grooves. Therefore, an active region comprising a plurality of quantum wires or quantum boxes can be obtained by a simple production process. In addition, this quantum wire or quantum box structure can be employed for an active region of a ridge type semiconductor laser, a groove type semiconductor laser or the like, whereby a semiconductor laser device having a low threshold value and a low operation current can be easily obtained.

According to a method for manufacturing a semiconductor optical device in accordance with the present invention, a plurality of stripe-shaped grooves each having a rectangular cross-section whose width is sufficiently narrow to produce a quantum effect are formed on a semiconductor substrate or on a semiconductor layer on the substrate parallel to each other at an interval sufficiently narrow to produce a quantum effect. Or, a plurality of rectangular-shaped grooves each having a width and a length sufficiently narrow to produce a quantum effect is formed on the semiconductor substrate or the semiconductor layer in a checkerboard arrangement. Then, quantum well layers having thicknesses less than the depth of the groove and sufficiently thin to produce a quantum effect and barrier layers having thicknesses larger than the depth of the groove are alternatingly laminated on the wafer having the grooves while maintaining the concavo-convex configuration of the grooves. Therefore, a laser device having a structure comprising a plurality of quantum wires or quantum boxes can be produced without complicated etching processes or the like.

What is claimed is:

1. A semiconductor optical element comprising:
   a semiconductor layer;
   a plurality of generally parallel stripe-shaped grooves having approximately the same depth in said semiconductor layer, each groove having a rectangular cross-section generally perpendicular to said layer, each groove having a width sufficiently narrow to produce a quantum effect, the grooves being spaced apart at an interval sufficiently narrow to produce a quantum effect in a semiconductor layer of width equal to the interval; and
   a structure including alternatingly semiconductor quantum well and barrier layers disposed on said semiconductor layer, the quantum well layers having thicknesses less than the depth of said grooves and sufficiently thin to produce a quantum effect, the barrier layers having thicknesses larger than the depth of said grooves, said well layers and said barrier layers being alternatingly disposed on the semiconductor layer in the grooves and on regions of the semiconductor layer between adjacent grooves.

2. A semiconductor optical element in accordance with claim 1 wherein the thickness of each of said well layers is w, the thickness of each of said barrier layers is b, the depth of each of the grooves is d, and $$w < b, (w+b)/2 = d.$$

3. A semiconductor optical element in accordance with claim 1 wherein said grooves have a rectangular cross-section generally parallel to said semiconductor layer and each groove has a width sufficiently narrow and a length sufficiently short to produce a quantum effect, the grooves being disposed on said semiconductor layer in a checkerboard arrangement.

4. A semiconductor optical element in accordance with claim 1 wherein said semiconductor layer is a semiconductor substrate.

5. A semiconductor optical element in accordance with claim 1 including a semiconductor substrate on which said semiconductor layer is disposed.

6. A semiconductor optical element comprising:
   a semiconductor substrate;
   a semiconductor layer having a first energy band gap and disposed on said semiconductor substrate;
   a plurality of generally parallel stripe-shaped grooves, each groove having a rectangular cross-section generally perpendicular to said layer, each groove having a width sufficiently narrow to produce a quantum effect, the grooves being spaced apart at an interval sufficiently narrow to produce a quantum effect in a semiconductor layer of width equal to the interval; and
   a structure including alternatingly semiconductor quantum well and barrier layers disposed on said semiconductor layer, said quantum well layers comprising a semiconductor material having a second energy band gap smaller than the first energy band gap and having thicknesses less than the depth of the grooves and sufficiently thin to produce a quantum effect, said barrier layers comprising a semiconductor material having a third energy band gap larger than the second energy band gap and thicknesses larger than the depth of said grooves, said well layers and said barrier layers being alternatingly disposed on said semiconductor layer in the grooves and on regions of the semiconductor layer between adjacent grooves.

7. A semiconductor optical element in accordance with claim 6 wherein the thickness of each of said well layers is w, the thickness of each of said barrier layers is b, the depth of each of the grooves is d, and $$w < b, (w+b)/2 = d.$$

8. A semiconductor optical element in accordance with claim 6 wherein the width of each groove and the interval between adjacent grooves are each no more than approximately 200 angstroms.

9. A semiconductor optical element comprising:
a semiconductor substrate;
a semiconductor layer having a first energy band gap and disposed on said semiconductor substrate;
a plurality of rectangular-shaped recesses, each recess having a depth and a width sufficiently narrow an a length sufficiently short to produce a quantum effect, the recesses being formed in said semiconductor layer in a checkerboard arrangement;
a structure including alternating semiconductor quantum well and barrier layers disposed on said semiconductor layer, said quantum well layers comprising a semiconductor material having a second energy band gap smaller than the first energy band gap and having thicknesses less than the depth of the recesses and sufficiently thin to produce a quantum effect, said barrier layers comprising a semiconductor material having a third energy band gap larger than the second energy band gap and thicknesses larger than the depth of the recesses, said well layers and said barrier layers being alternatingly disposed on said semiconductor layer in the recesses and on regions of said semiconductor layer between adjacent recesses.

10. A semiconductor optical element in accordance with claim 9 wherein the thickness of each of said well layers is w, the thickness of each of said barrier layers is b, the depth of each of the grooves is d, and $w < b, (w+b)/2 = d$.

11. A semiconductor optical element in accordance with claim 9 wherein the widths and the lengths of said recesses are both no more than approximately 200 angstroms.

12. A semiconductor optical element comprising:
a semiconductor substrate;
a first conductivity type first semiconductor layer having a first energy band gap and disposed on said semiconductor substrate;
a plurality of generally parallel stripe-shaped grooves, each groove having a rectangular cross-section generally perpendicular to said layer, each groove having a width sufficiently narrow to produce a quantum effect, the grooves being spaced apart at an interval sufficiently narrow to produce a quantum effect in a semiconductor layer of width equal to the interval; and
a structure including alternatingly semiconductor quantum well and barrier layers disposed on said semiconductor layer, said quantum well layers comprising a semiconductor material having a second energy band gap smaller than the first energy band gap and having thicknesses less than the depth of the grooves and sufficiently thin to produce a quantum effect, said barrier layers comprising a semiconductor material having a third energy band gap larger than the second energy band gap and thicknesses larger than the depth of said grooves, said well layers and said barrier layers being alternatingly disposed on said semiconductor layer in the grooves and on regions of the semiconductor layer between adjacent grooves;
a second conductivity type second semiconductor layer having a fourth energy band gap larger than said second energy band gap disposed on said structure of quantum well and barrier layers and having a centrally disposed stripe-shaped ridge; and
a first conductivity type third semiconductor layer disposed on said second conductivity type second semiconductor layer adjacent said stripe-shaped ridge.

13. A semiconductor optical element in accordance with claim 12 wherein said grooves have a rectangular cross-section generally parallel to said semiconductor layer and each groove has a width sufficiently narrow and a length sufficiently short to produce a quantum effect, said grooves being formed on said semiconductor layer in a checkerboard arrangement.

14. A semiconductor optical element as defined in claim 13 comprising a second conductivity type fourth semiconductor layer disposed on said first conductivity type second semiconductor layer and said stripe-shaped ridge, a first electrode disposed on said second conductivity type fourth semiconductor layer, and a second electrode disposed on said substrate.

15. A semiconductor optical element comprising:
a semiconductor substrate;
a first conductivity type first semiconductor layer having a first energy band gap and disposed on said semiconductor substrate;
a plurality of generally parallel stripe-shaped grooves, each groove having a rectangular cross-section generally perpendicular to said layer, each groove having a width sufficiently narrow to produce a quantum effect, the grooves being spaced apart at an interval sufficiently narrow to produce a quantum effect in a semiconductor layer of width equal to the interval;
a structure including alternatingly semiconductor quantum well and barrier layers disposed on said semiconductor layer, said quantum well layers comprising a semiconductor material having a second energy band gap smaller than the first energy band gap and having thicknesses less than the depth of the grooves and sufficiently thin to produce a quantum effect, said barrier layers comprising a semiconductor material having a third energy band gap larger than the second energy band gap and thicknesses larger than the depth of said grooves, said well layers and said barrier layers being alternatingly disposed on said semiconductor layer in the grooves and on regions of the semiconductor layer between adjacent grooves;
a second conductivity type second semiconductor layer having a fourth energy band gap larger than said second energy band gap disposed on said structure of quantum well and barrier layers;
a first conductivity type third semiconductor layer disposed on said second conductivity type second semiconductor layer including a centrally disposed stripe-shaped groove penetrating through said first conductivity type third semiconductor layer and exposing said second conductivity type second semiconductor layer; and
a second conductivity type fourth semiconductor layer disposed on said first conductivity type third semiconductor layer and on said second conductivity type second semiconductor layer exposed by the stripe-shaped groove.

16. A semiconductor optical element in accordance with claim 15 wherein said grooves have a rectangular cross-section generally parallel to said semiconductor layer and each groove has a width sufficiently narrow and a length sufficiently short to produce a quantum effect, said grooves being formed on said semiconductor layer in a checkerboard arrangement.

17. A semiconductor optical element in accordance with claim 15 comprising a first electrode disposed on said second conductivity type fourth semiconductor layer and a second electrode disposed on said substrate.

18. A semiconductor optical element in accordance with claim 1 wherein the width of each groove and the interval between adjacent grooves are each no more than approximately 200 angstroms.

19. A semiconductor optical element in accordance with claim 12 wherein the width of each groove and the interval between adjacent grooves are each no more than approximately 200 angstroms.

20. A semiconductor optical element in accordance with claim 15 wherein the width of each groove and the interval between adjacent grooves are each no more than approximately 200 angstroms.

* * * * *